US009728750B2

(12) United States Patent
Wehlus (10) Patent No.: US 9,728,750 B2
(45) Date of Patent: Aug. 8, 2017

(54) RADIATION-EMITTING DEVICE (71) Applicant: OSRAM OLED GmbH, Regensburg (DE)

(72) Inventor: Thomas Wehlus, Lappersdorf (DE)

(73) Assignee: OSRAM OLED GmbH (DE)

( * ) Notice: Subject to any disclaimer, the term of this patent is extended or adjusted under 35 U.S.C. 154(b) by 128 days.

(21) Appl. No.: 14/377,718

(22) PCT Filed: Feb. 5, 2013

(86) PCT No.: PCT/EP2013/052242
§ 371 (c)(1),
(2) Date: Aug. 8, 2014

(87) PCT Pub. No.: WO2013/117544
PCT Pub. Date: Aug. 15, 2013

(65) Prior Publication Data
US 2016/0013447 A1   Jan. 14, 2016

(30) Foreign Application Priority Data
Feb. 10, 2012   (DE) .................. 10 2012 202 041

(51) Int. Cl.
*H01L 51/52*   (2006.01)
*H01L 27/32*   (2006.01)

(52) U.S. Cl.
CPC ...... *H01L 51/5268* (2013.01); *H01L 51/5225* (2013.01); *H01L 51/5275* (2013.01); *H01L 27/326* (2013.01)

(58) Field of Classification Search
CPC ....... H01L 31/12; H01L 31/125; H01L 51/50; H01L 51/5278; H01J 1/62
See application file for complete search history.

(56) References Cited

U.S. PATENT DOCUMENTS 8,743,077 B1 *   6/2014   Sprague ............... G06F 1/1643
                                                    345/1.1
2005/0001796 A1 *   1/2005   Liu ...................... G02B 6/0038
                                                    345/87
(Continued)

FOREIGN PATENT DOCUMENTS

DE      103 53 992           6/2005
DE      10353992 A1 *        6/2005   ......... H01L 27/3239
(Continued)

OTHER PUBLICATIONS

Machine Translation of German Patent Publication No. DE 10353992 A1 retrieved from Google Patent website: https://patents.google.com/ on Jan. 26, 2016.*
(Continued)

*Primary Examiner* — Michael Jung
*Assistant Examiner* — Mikka Liu
(74) *Attorney, Agent, or Firm* — DLA Piper LLP (US)

(57) ABSTRACT

A radiation-emitting device includes a substrate, at least one layer sequence arranged on the substrate and adapted to generate electromagnetic radiation, including at least one first electrode surface, at least one second electrode surface, and at least one functional layer between the first electrode surface and the second electrode surface, wherein the functional layer is adapted to generate electromagnetic radiation in a switched-on operating state, at least one transparency region transparent to at least one partial spectrum of electromagnetic radiation at least in a switched-off operating state, and at least one non-transparency region non-transparent to the partial spectrum of electromagnetic radiation, wherein the transparency region and the non-transparency region are arranged such that electromagnetic radiation from the partial spectrum can pass through the radiation-emitting device through the transparency region.

19 Claims, 9 Drawing Sheets (56) References Cited

U.S. PATENT DOCUMENTS

| | | | |
|---|---|---|---|
| 2007/0257608 A1 | 11/2007 | Tyan et al. | |
| 2010/0237374 A1 | 9/2010 | Chu et al. | |
| 2010/0315817 A1* | 12/2010 | Zimmermann | G02B 6/0041 362/296.01 |
| 2011/0001864 A1* | 1/2011 | Okinaka | H01L 51/5012 348/333.01 |
| 2011/0193477 A1* | 8/2011 | Lifka | H01L 51/0015 313/504 |
| 2012/0139424 A1* | 6/2012 | Pasveer | H01L 27/288 315/149 |

FOREIGN PATENT DOCUMENTS

| | | |
|---|---|---|
| DE | 10 2008 051 012 | 4/2010 |
| WO | 2006/049807 | 5/2006 |
| WO | 2010/046833 | 4/2010 |
| WO | 2010/070563 | 6/2010 |
| WO | 2011/158185 | 12/2011 |

OTHER PUBLICATIONS

Do, Y., et al., "Enhanced Light Extraction from Organic Light-Emitting Diodes with 2D SiO2/SiNx Photonic Crystals," Wiley-VCH Verlag GmBh & Co. KGaA, *Advanced Materials*, 2003, vol. 15, No. 14, pp. 1214-1218.

Sun. Y., et al., "Enhanced light out-coupling of organic light-emitting devices using embedded low-index grids," *Nature Photonics*, vol. 2, Aug. 2008, pp. 483-487.

Ziebarth, J.M., et al., "Extracting Light from Polymer Light-Emitting Diodes Using Stamped Bragg Gratings," *Advanced Functional Materials*, vol. 14, No. 5, May 2004, pp. 451-456.

\* cited by examiner

RADIATION-EMITTING DEVICE

TECHNICAL FIELD

This disclosure relates to radiation-emitting devices.

BACKGROUND

Radiation-emitting devices are suitable as large-area, thin lighting elements. In many applications it is desirable for the radiation-emitting devices to be transparent. On account of their construction, however, this is accompanied by an impairment of their efficiency.

In conventional transparent organic light-emitting diodes (OLEDs), for example, only part of the generated light is coupled out directly. The rest of the light generated in the active region dissipates in various loss channels such as in light guided by wave guiding effects in the substrate, in a transparent electrode and in organic layers, and also in surface plasmons which can be generated at the surface of a metallic electrode. The wave guiding effects can occur in particular as a result of the differences in refractive index at the interfaces between the individual layers and regions of an OLED. The light guided in the loss channels cannot be coupled out from an OLED in particular without additional technical measures.

To increase the coupling-out of light and thus the emitted light power, measures are known to couple out the light guided in a substrate as emitted light. For this purpose, films comprising scattering particles or films comprising surface structures such as microlenses, for instance, are used, for example, on the outer side of the substrate. It is also known to provide a direct structuring of the outer side of the substrate or to introduce scattering particles into the substrate. Some of these approaches, for example, the use of scattering films, are already used commercially and can be scaled up with regard to the emission area particularly OLED lighting modules. However, these approaches to coupling out light have major disadvantages that the coupling-out efficiency is limited to approximately 60 to 70% of the light guided in the substrate, and the appearance of the OLED is significantly influenced since a milky, diffusely reflective surface is produced by the layers or applied films.

Furthermore, approaches are known to couple out the light guided in organic layers or in a transparent electrode. However, these approaches to date have not yet gained commercial acceptance in OLED products. By way of example, Y. Sun, S. R. Forrest, Nature Photonics 2,483 (2008), proposes forming so-called "low-index grids", wherein structured regions comprising a material having a low refractive index are applied to a transparent electrode. Furthermore, it is also known to apply high refractive index scattering regions below a transparent electrode in a polymeric matrix as is described, for example, in US 2007/0257608. In that case, the polymeric matrix generally has a refractive index of approximately 1.5 and is applied wet-chemically. Furthermore, so-called "Bragg-gratings" or photonic crystals having periodic scattering structures having structure sizes in the light wavelength range are also known as described, for example, in Ziebarth et al., Adv. Funct. Mat. 14, 451 (2004) and Do et al., Adv. Mat. 15, 1214 (2003).

However, those measures, too, all suffer from the defect that they cause the OLEDs to appear diffuse and the actual transparency effect is lost.

A further problem in large-area radiation-emitting devices is that they often have a voltage drop across their total surface area, the voltage drop having an effect on the luminance and thus on the brightness. The light emitted by the radiation-emitting devices is therefore not homogeneous, but rather has differences in luminance.

It could therefore be helpful to provide an effectively transparent radiation-emitting device having improved properties regarding efficiency or homogeneity of the brightness.

SUMMARY

I provide a radiation-emitting device comprising a substrate, at least one layer sequence arranged on the substrate and adapted to generate electromagnetic radiation, comprising at least one first electrode surface, at least one second electrode surface, and at least one functional layer between the first electrode surface and the second electrode surface, wherein the functional layer is adapted to generate electromagnetic radiation in a switched-on operating state, at least one transparency region, transparent to at least one partial spectrum of electromagnetic radiation at least in a switched-off operating state, and at least one non-transparency region, non-transparent to the partial spectrum of electromagnetic radiation, wherein the transparency region and the non-transparency region are arranged such that electromagnetic radiation from the partial spectrum can pass through the radiation-emitting device through the transparency region.

I also provide a radiation-emitting device comprising a substrate, at least one layer sequence arranged on the substrate and adapted to generate electromagnetic radiation, comprising at least one first electrode surface, at least one second electrode surface, and at least one functional layer between the first electrode surface and the second electrode surface, wherein the functional layer is adapted to generate electromagnetic radiation in a switched-on operating state, at least one transparency region, transparent to at least one partial spectrum of electromagnetic radiation at least in a switched-off operating state, and at least one non-transparency region, non-transparent to the partial spectrum of electromagnetic radiation, wherein the transparency region and the non-transparency region are arranged such that electromagnetic radiation from the partial spectrum can pass through the radiation-emitting device through the transparency region and wherein the at least one transparency region occupies less than 10% of a total surface area of the radiation-emitting device perpendicular to a viewing axis.

I further provide a radiation-emitting device comprising a substrate, at least one layer sequence arranged on the substrate and adapted to generate electromagnetic radiation, comprising at least one first electrode surface, at least one second electrode surface, and at least one functional layer between the first electrode surface and the second electrode surface, wherein the functional layer is adapted to generate electromagnetic radiation in a switched-on operating state, at least one transparency region, transparent to at least one partial spectrum of electromagnetic radiation at least in a switched-off operating state, and at least one non-transparency region, non-transparent to the partial spectrum of electromagnetic radiation, wherein the transparency region and the non-transparency region are arranged such that electromagnetic radiation from the partial spectrum can pass through the radiation-emitting device through the transparency region and wherein at least one coupling-out element is arranged in the at least one non-transparency region, the coupling-out element adapted to couple out electromagnetic radiation from the layer sequence.

My radiation-emitting devices may comprise a substrate and at least one layer sequence arranged on the substrate and generate electromagnetic radiation. The layer sequence comprises at least one first electrode surface, at least one second electrode surface and at least one functional layer between the first electrode surface and the second electrode surface. The functional layer generates electromagnetic radiation in a switched-on operating state.

The fact that one layer or one element is arranged or applied "on" or "above" another layer or another element or else "between" two other layers or elements can mean, here and hereinafter, that the one layer or the one element is arranged directly in direct mechanical and/or electrical contact on the other layer or the other element. Furthermore, it can also mean that the one layer or one element is arranged indirectly on or above the other layer or the other element. In this case, further layers and/or elements can then be arranged between the one layer and the other layer or the one element and the other element.

Furthermore, the radiation-emitting device comprises at least one transparency region transparent to at least one partial spectrum of electromagnetic radiation at least in a switched-off operating state, and at least one non-transparency region non-transparent to the partial spectrum of electromagnetic radiation. The transparency region and the non-transparency region are arranged such that electromagnetic radiation from the partial spectrum can pass through the radiation-emitting device through the transparency region.

The property that the radiation-emitting device comprises both a transparency region and a non-transparency region advantageously makes it possible to arrange in the radiation-emitting device auxiliary elements improving the optical properties of the radiation-emitting device, but without having to dispense with the transparent property of the radiation-emitting device completely.

The property that the transparency region is transparent to at least one partial spectrum of electromagnetic radiation at least in a switched-off operating state is not restricted to the situation where no absorption or scattering of the electromagnetic radiation whatsoever occurs in the transparency region or the transparency region has a transmittance equal to 1. Rather, this also encompasses, for example, when a slight scattering or absorption of the electromagnetic radiation occurs in the transparency region, but the transparency region is sufficiently image- or viewing-transmissive to allow an external observer to be provided with a sharp imaging of an object situated behind the radiation-emitting device from the point of view of the observer by the electromagnetic radiation passing through the transparency region. Preferably, the transparency region has a higher transmittance than the non-transparency region. It is furthermore preferred for the transparency region to have a transmittance of greater than 0.5.

It is furthermore preferred for the partial spectrum of electromagnetic radiation to correspond to the visible spectrum such that the transparency region is transparent to visible light at least in a switched-off operating state.

The electromagnetic radiation generated by the functional layer need not correspond to the partial spectrum of electromagnetic radiation to which the transparency region is transparent. Rather, by way of example, the transparency region can be transparent to the visible spectrum, while the functional layer only generates electromagnetic radiation having a specific wavelength.

Preferably, the radiation-emitting device is a surface device, which, however, need not be planar, but rather can, for example, also be flexible.

If the radiation-emitting device is a surface device, then the transparency region is transparent to the partial spectrum of electromagnetic radiation preferably at least along a viewing axis perpendicular to the surface.

The property that the non-transparency region is non-transparent to the partial spectrum of electromagnetic radiation can mean, in particular, that it is translucent (i.e. light-transmissive, but not image- or viewing-transmissive) or opaque.

The layer sequence that generates electromagnetic radiation can be arranged at least partly in the transparency region and/or can be arranged at least partly in the non-transparency region. Accordingly, the electromagnetic radiation can be generated in the transparency region and/or in the non-transparency region. That part of the layer sequence arranged in the transparency region, and in particular the electrode surfaces that it comprises, are preferably transparent.

The at least one functional layer may comprise an organic functional layer, in particular an organic electroluminescent layer. The radiation-emitting device can be in particular an organic light-emitting diode (OLED) or comprise such a diode.

The radiation-emitting device may comprise a plurality of transparency regions. The transparency regions can merge into one another, but are preferably perceived by an external observer as arranged in a separated manner.

The transparency regions may be spatially separated from one another.

The transparency regions may occupy less than 30%, in particular less than 10%, of a total surface area of the radiation-emitting device perpendicular to a viewing axis. A sufficient effect can be achieved even if the transparency regions occupy less than 5% of the total surface area of the radiation-emitting device perpendicular to the viewing axis.

The distance between two transparency regions may be chosen to be so small that an external observer does not perceive the region boundaries as disturbing, but rather receives as much as possible the impression of a transition-less viewing-transmissivity of the radiation-emitting device. Preferably, the distance between two transparency regions is less than 1 cm, in particular less than 3 mm.

The transparency regions are distributed homogeneously in the radiation-emitting device. If the radiation-emitting device is a planar device, then the transparency regions are preferably distributed homogeneously such that an external observer receives the optical impression that the radiation-emitting device is transparent uniformly across its total surface area.

The transparency regions may be distributed in a disordered fashion in the radiation-emitting device.

The transparency regions may be strip-shaped and arranged parallel to one another.

The transparency regions may be arranged in a two-dimensional, in particular rectangular or hexagonal lattice.

At least one coupling-out element that couples out electromagnetic radiation from the substrate or the layer sequence that generates electromagnetic radiation may be arranged in the at least one non-transparency region. An increase in the efficiency of the radiation-emitting device is thereby achieved, but this is not obtained or is only partly obtained at the expense of the effective transparency of the radiation-emitting device.

The coupling-out element can be arranged in various ways in the at least one non-transparency region. In this regard, in the at least one non-transparency region a scattering layer can be provided, which comprises a matrix material and scattering particles having a different refractive index from the matrix material. Alternatively, or additionally, in the at least one non-transparency region the first electrode surface and/or the second electrode surface can be nanostructured, in particular periodically nanostructured. Alternatively or additionally, in the at least one non-transparency region low index microstructures can be introduced between the first electrode surface and the functional layer and/or between the second electrode surface and the functional layer. Alternatively or additionally, in the at least one non-transparency region scattering particles can be applied to the first electrode surface and/or to the second electrode surface. Alternatively or additionally, in the at least one non-transparency region microstructures, in particular micro lenses, micropyramids, or microstructures produced by roughening can be provided on an outer surface of the substrate.

The first electrode surface may be transparent, and the second electrode surface may be reflective and arranged in the at least one non-transparency region.

The first and second electrode surfaces may be transparent.

The first electrode surface may be transparent and at least one first auxiliary electrode conductively connected to the first electrode surface may be arranged in the non-transparency region. Alternatively or additionally, the second electrode surface is transparent and at least one second auxiliary electrode conductively connected to the second electrode surface is arranged in the non-transparency region. Preferably, the first auxiliary electrode and/or the second auxiliary electrode are/is designed to reduce a voltage drop across the transparent electrode surface/electrode surfaces connected to it/them. Preferably, the first auxiliary electrode and/or the second auxiliary electrode contain(s) a metal.

The first auxiliary electrode may be reflective. Alternatively or additionally, the second auxiliary electrode is reflective.

Further advantages will become apparent from the examples described below in conjunction with the figures.

In the examples and figures, elements that are identical, of identical type or act identically may be provided with the same reference signs. The illustrated elements and their size relationships among one another should not be regarded as true to scale. Rather, individual elements such as, for example, layers, structural parts, components and regions may be illustrated with more than proportional size to enable better illustration and/or to afford a better understanding. This may relate to individual dimensions or to all the dimensions of the elements.

Figure 1:
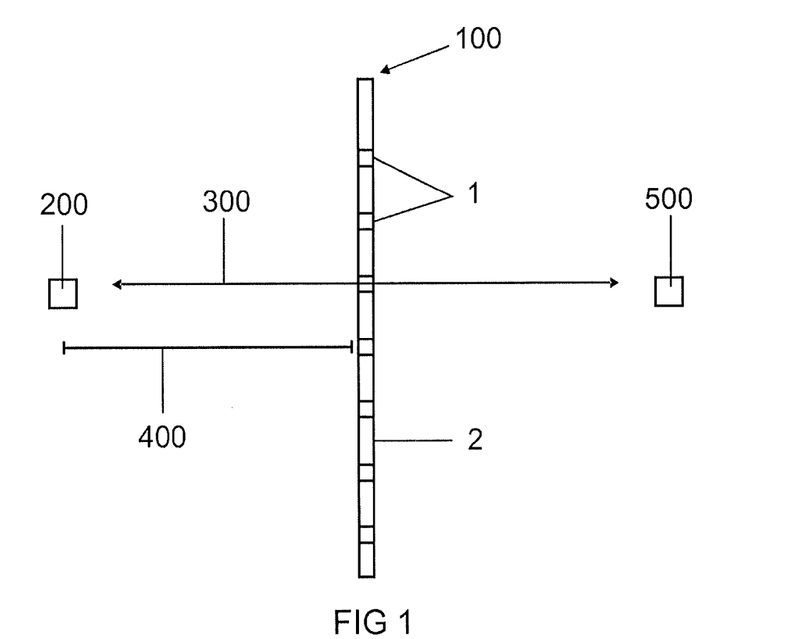
FIGS. 1 and 2 show schematic illustrations of a radiation-emitting device in accordance with one example in side and front views, respectively.

FIG. 1 shows a first example of a radiation-emitting device, the device designated by 100 in its entirety, with the aid of a schematic side view. The radiation-emitting device 100 is of large-area design and occupies a surface area of greater than or equal to 1 square decimeter. It is illustrated in relation to an external observer 200 such that the observer observes the device along a viewing axis 300 and its surface is perpendicular to the viewing axis 300.

A plurality of transparency regions 1 transparent to light at least in a switched-off operating state of the radiation-emitting device 100 are provided in the radiation-emitting device 100. Consequently, light emitted by an object 500 can pass through the radiation-emitting device 100 through the transparency regions 1 along the viewing axis 300 in an unimpeded manner. What is thereby achieved is that the external observer 200, from a representative viewing distance 400, along the viewing axis 300, can look through the transparency regions 1 of the radiation-emitting device 100 and clearly discern the object 500 arranged behind the latter.

Figure 2:
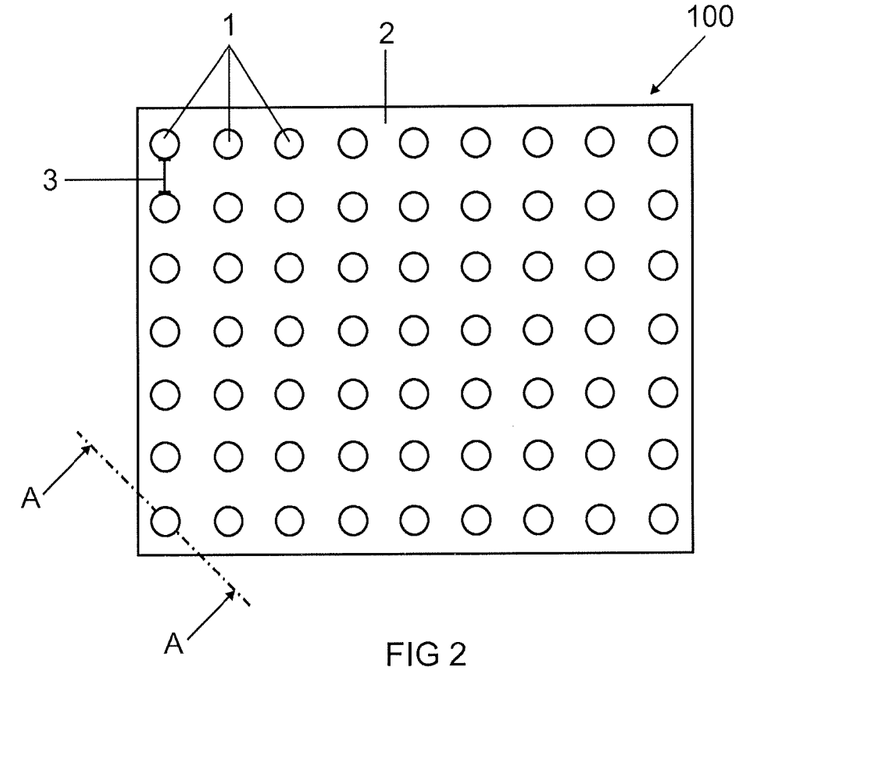

FIG. 2 shows the radiation-emitting device illustrated in FIG. 1 in a front view from the point of view of the external observer 200. FIG. 2 shows that the transparency regions 1 have a circular cross section and are arranged in a square lattice extending over the total surface area of the radiation-emitting device 100.

The distance between two transparency regions 1, the distance being designated by 3, is chosen to be so small that the external observer, at least from the representative viewing distance 400, does not perceive the transparency regions 1 as being spatially separated, and is preferably less than 3 mm. The radius of the circular cross section of the transparency regions 1 is chosen such that the transparency regions 1 cover overall only 30% or less of the total surface area of the radiation-emitting device 100.

That part of the radiation-emitting device 100 not formed by the transparency regions 1 forms the continuous non-transparency region 2 bounding and enclosing each of the transparency regions 1. The non-transparency region 2 is either translucent or opaque and makes no contribution to a clear imaging of the object 500 arranged behind the radiation-emitting device 100.

The boundaries between the cylindrically shaped transparency regions 1 and the non-transparency region 2 run parallel to the viewing axis 300 such that the transparency regions 1 and the non-transparency region 2 do not overlap one another if they are observed along the viewing axis 300.

Figure 3:
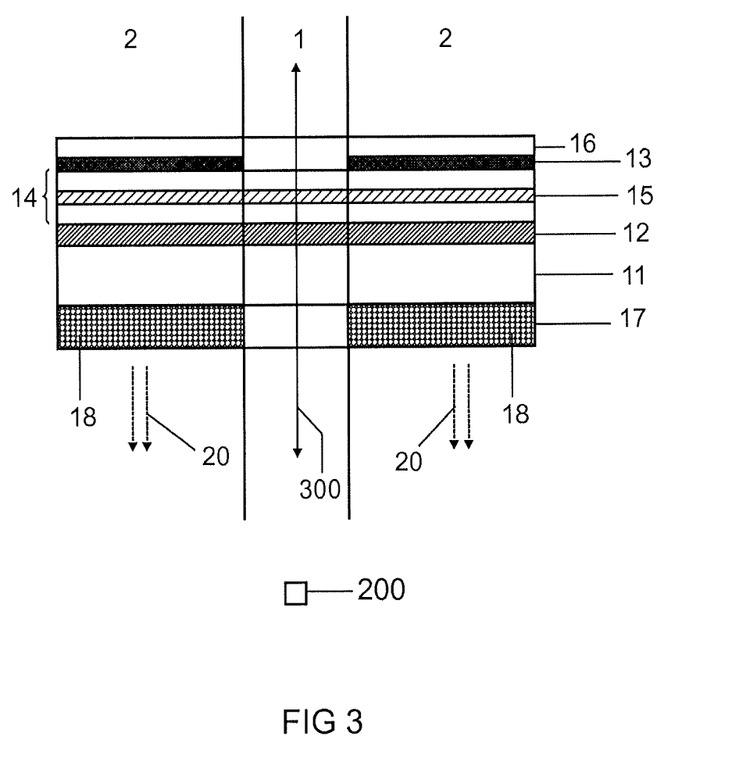
FIGS. 3 to 8 show schematic sectional views of the radiation-emitting device in accordance with a plurality of examples.

FIG. 3 schematically illustrates a sectional view along the line A-A through the radiation-emitting device 100 in accordance with FIG. 1.

This sectional illustration reveals the multilayered construction of the radiation-emitting device 100, wherein the number and structure of layers arranged in the transparency region 1 differ from those of the layers arranged in the non-transparency region 2.

The radiation-emitting device 100 illustrated in FIG. 3 comprises a substrate 11 on which an organic functional layer stack 14 having an organic electroluminescent layer 15 is arranged between a transparent electrode surface 12 and an electrode surface 13 in a reflective fashion. An encapsulation arrangement 16 that protects the organic layers is arranged thereabove. In this case, the encapsulation arrangement 16 is preferably a thin-film encapsulation.

In FIGS. 3 to 8, a reflective electrode surface is identified as black, an organic electroluminescent layer is identified by coarse hatching and a transparent electrode surface is identified by fine hatching.

While in the example illustrated in FIG. 3 the substrate 11, the transparent electrode surface 12, the functional layer stack 14 and the encapsulation arrangement 16 extend over the entire surface area of the radiation-emitting device 100, the reflective electrode surface 13 extends only over the non-transparency region 2.

The substrate 11 is transparent, for example, in the form of a glass plate or glass layer. The transparent electrode surface 12 applied on the substrate 11, the electrode surface being an anode, comprises a transparent conductive oxide (TCO) or consists of a transparent conductive oxide. Transparent conductive oxides are transparent conductive materials, generally metal oxides such as, for example, zinc oxide, tin oxide, cadmium oxide, titanium oxide, indium oxide or indium tin oxide (ITO).

The reflective electrode surface 13 comprises a metal, for example, which can be selected from aluminum, barium, indium, silver, gold, magnesium, calcium and lithium, and compounds, combinations and alloys thereof.

The organic functional layer stack 14 having the organic electroluminescent layer 15 comprises, for example, a hole injection layer, a hole transport layer, an electron blocking layer, a hole blocking layer, an electron transport layer and/or an electron injection layer, suitable for conducting holes and/or electrons to the organic electroluminescent layer 15 or blocking the respective transport. Suitable layer constructions for the organic functional layer stack 14 are known and are therefore not explained any further.

An optical scattering layer 17 is arranged on that side of the substrate 11 facing away from the transparent electrode surface 12. The scattering layer comprises a normally refractive, transparent material having a refractive index of at least 1.5, for example glass or a polymer material such as polymethyl methacrylate, polycarbonate, polyethylene naphthalate, polyethylene terephthalate, polyurethane or a combination thereof, which forms a matrix material of the scattering layer 17.

Scattering particles 18 are introduced into the matrix material of the scattering layer 17 in the non-transparency region 2. In this case, the scattering particles 18 have a size of greater than or equal to 200 nm and less than or equal to 5000 nm and a different refractive index compared to the matrix material. By way of example, the scattering particles 18 can have a higher refractive index than the matrix material. In particular, scattering particles consisting of titanium oxide or zirconium oxide, for example, are suitable for this purpose. It is also possible for the scattering particles to have a lower refractive index than the matrix material. In this case, the scattering particles 18 can consist of silicon dioxide, for example, or can be pores, for example, as air-filled pores.

The scattering layer 17 has no scattering particles 18 in the transparency region 1. Consequently, all the layers arranged in the transparency region 1 are transparent to light such that light emitted by the object 500 illustrated in FIG. 1 can pass through the radiation-emitting device 100 through the transparency region 1 along the viewing axis 300 in an unimpeded manner.

The radiation-emitting device 100 illustrated in FIG. 3 is a bottom emitter and, in a switched-on operating state, emits light having a specific wavelength through the transparent electrode surface 12 and the transparent substrate 11 in the direction of the external observer 200, which is identified by the arrows designated by 20 in FIG. 3. In this case, diffuse light of high intensity is emitted as a result of the effect of the scattering particles 18. No or only little light is generated in the transparency region 1 since the reflective electrode surface 13 is interrupted in this region and therefore cannot supply the functional layer stack 14 with current.

Figure 4:
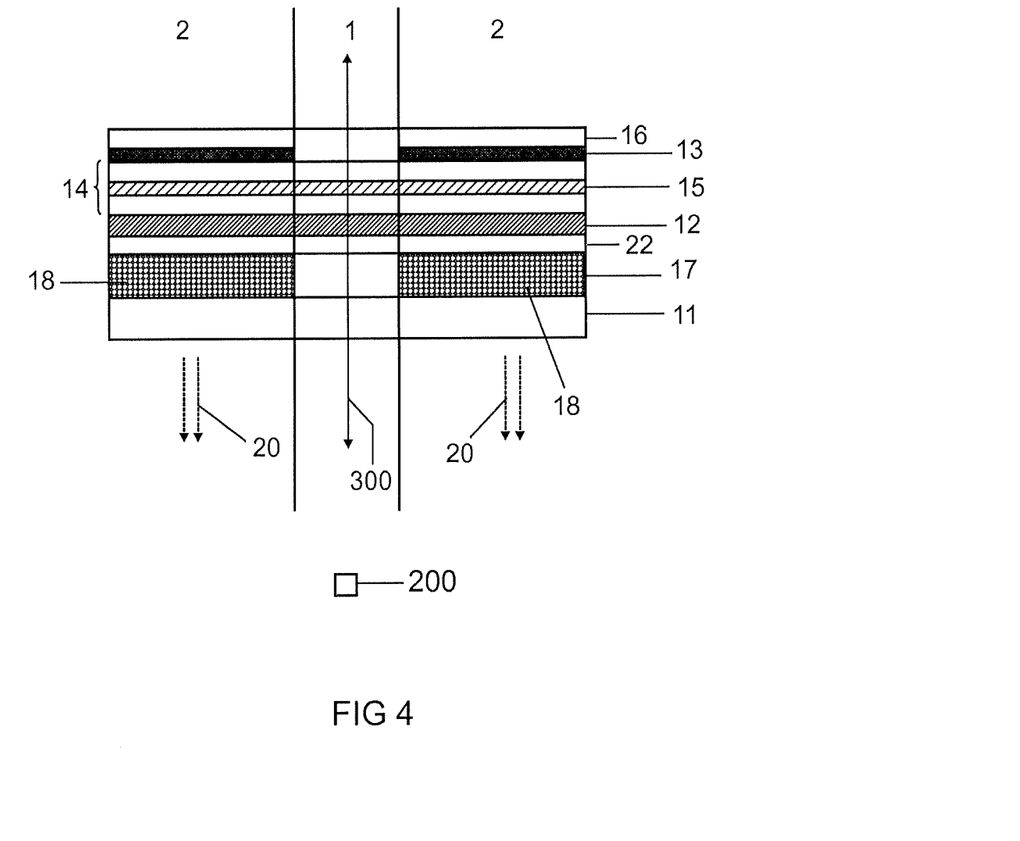

In the case of the radiation-emitting device 100 in accordance with the example in FIG. 4, compared to the example in FIG. 3, the scattering layer 17 is arranged between the substrate 11 and the transparent electrode surface 12. In both examples, the optical scattering layer 17 is arranged on a side of the transparent electrode surface 12 facing away from the organic electroluminescent layer 15. An additional encapsulation layer, for example, in the form of a thin-film encapsulation 22, is arranged between the scattering layer 17 and the transparent electrode 12 to protect the organic layers of the organic functional layer stack 14 against penetration of harmful substances through the scattering layer 17. With the exception of a different coupling-out mechanism, the two examples illustrated in FIGS. 3 and 4 have a similar manner of operation.

Figure 5:
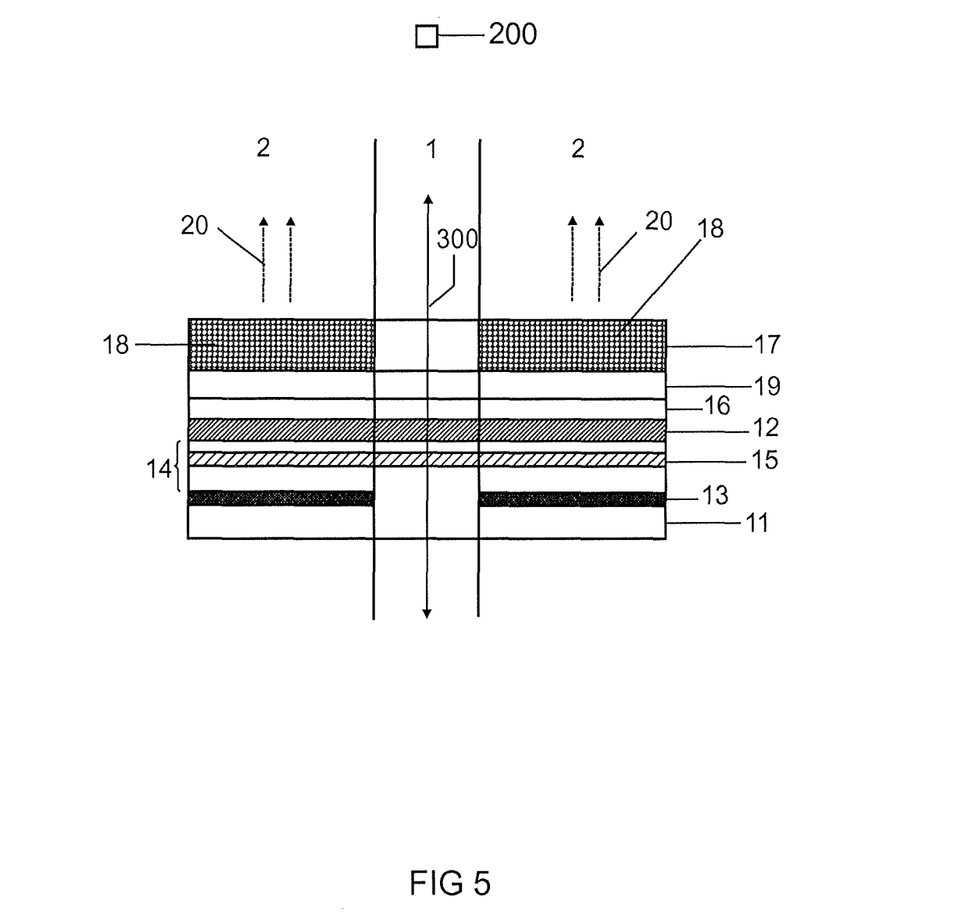
Figure 6:
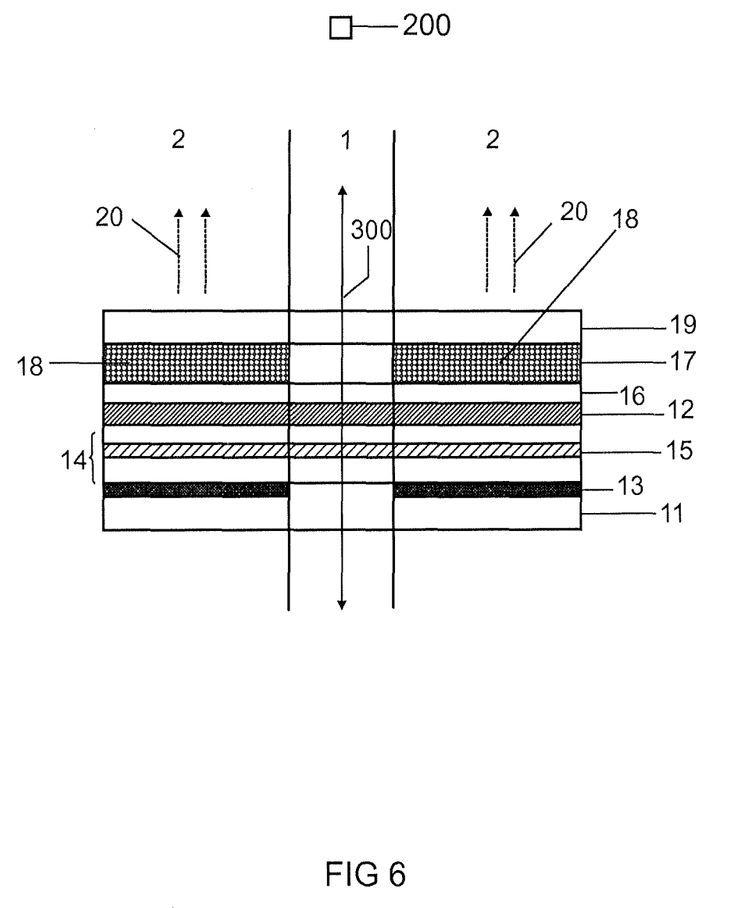

In the examples in FIGS. 5 and 6, the radiation-emitting device 100 is a so-called "top emitter," in which the scattering layer 17 is arranged on that side of the organic electroluminescent layer 15 facing away from the substrate 11.

In both examples, the reflective electrode surface 13 arranged only in the non-transparency region 2, is provided as an anode arranged above the substrate 11. The transparent electrode surface 12, which extends over the total surface area of the radiation-emitting device 100, is provided as a cathode and arranged above the organic functional layer stack 14. As viewed from the substrate 11, a covering layer 19 is arranged above the organic functional layer stack 14, which covering layer is transparent and can be, for example, in the form of a glass layer or a glass plate.

Once again, the preferred viewpoint of the external observer 200 is situated on the side of the radiation-emitting device 100 toward which the light generated in the organic electroluminescent layer 15 is emitted for the most part, that is to say in the upper part of FIGS. 5 and 6.

Figure 7:
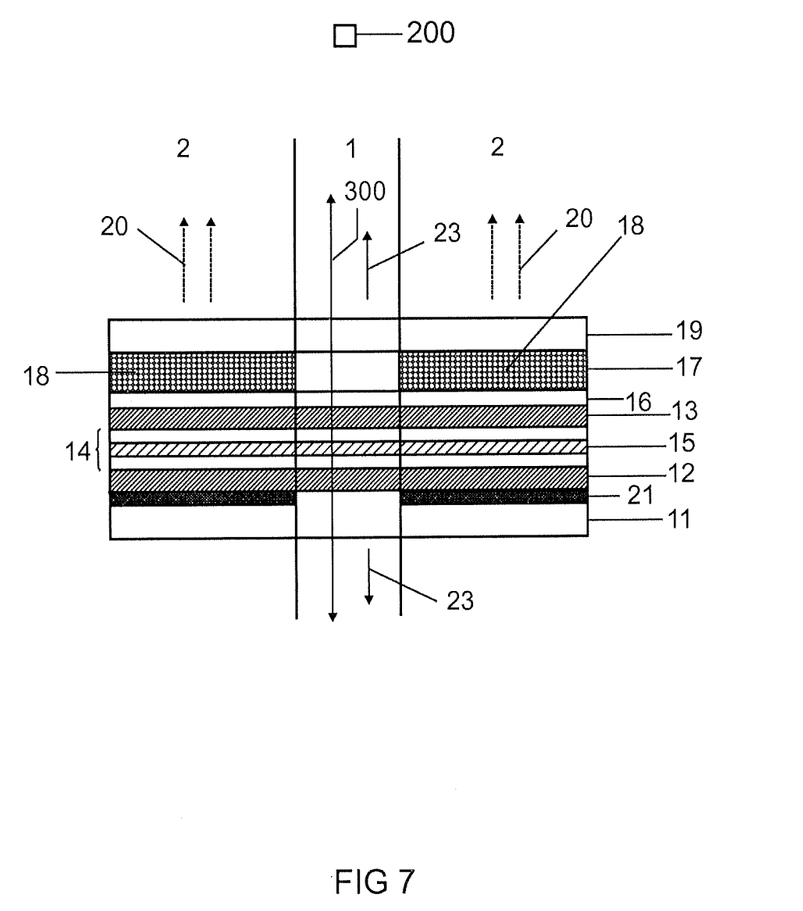

FIG. 7 shows an example of the radiation-emitting device 100 in which the first electrode surface 12 and the second electrode surface 13 are transparent and extend over the total surface area of the radiation-emitting device 100. An auxiliary electrode 21 extends over the entire non-transparency region 2, the auxiliary electrode conductively connecting to the first electrode surface 12. The auxiliary electrode 21 is formed from a reflective metal and reduces a lateral voltage drop across the first electrode surface 12.

In the switched-on operating state, compared to the examples shown in FIGS. 3 to 6, light 23 is additionally generated in the transparency region 1 and emitted toward both sides of the radiation-emitting device. In this case, the transparent property of the transparency regions 1 is dependent on the intensity of the electromagnetic radiation generated in them. Given sufficiently low intensity, the transparency regions 1 remain transparent even in the switched-on operating state and furthermore allow imaging of the object 500 arranged behind the radiation-emitting device 100, but with a reduced contrast. Given an increased intensity, however, the electromagnetic radiation 23 generated in the non-transparency regions 1 outshines the radiation generated by the object 500.

Figure 8:
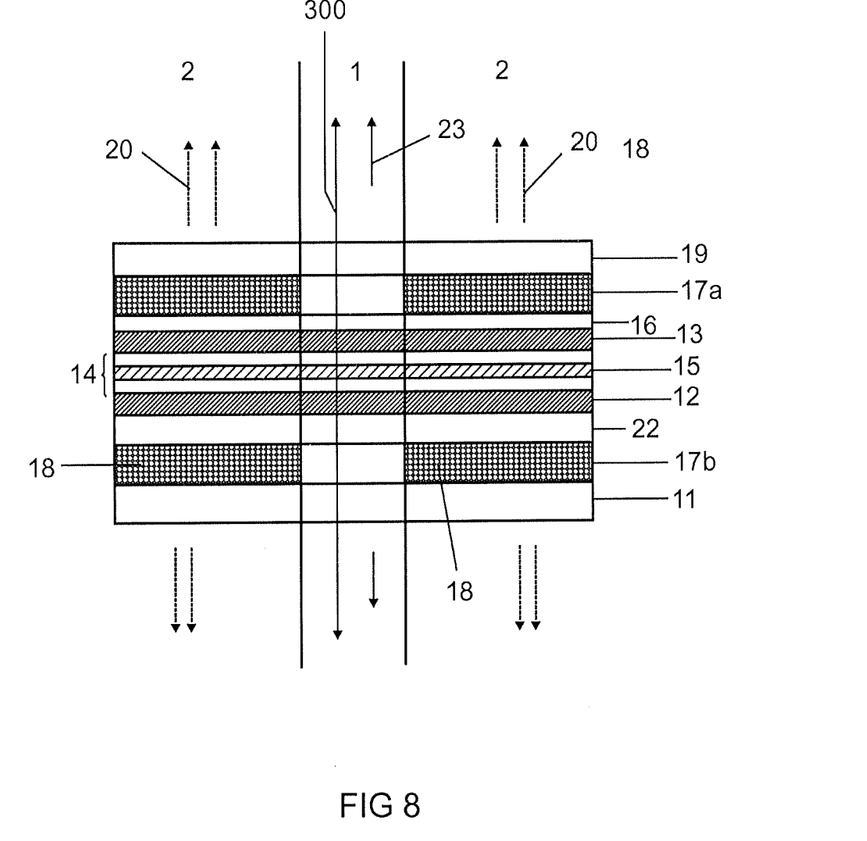

FIG. 8 shows an example of the radiation-emitting device 100 in which the first electrode surface 12 and the second electrode surface 13 are transparent and extend over the total surface area of the radiation-emitting device 100. A first scattering layer 17a is arranged above the first electrode surface 12 as viewed from the organic functional layer stack 14. A second scattering layer 17b is arranged above the second electrode surface 13 as viewed from the organic functional layer stack 14.

In the switched-on operating state, compared to the examples shown in FIGS. 3 to 7, light is emitted toward both sides of the radiation-emitting device such that a double-sided emitter arises.

Figure 9:
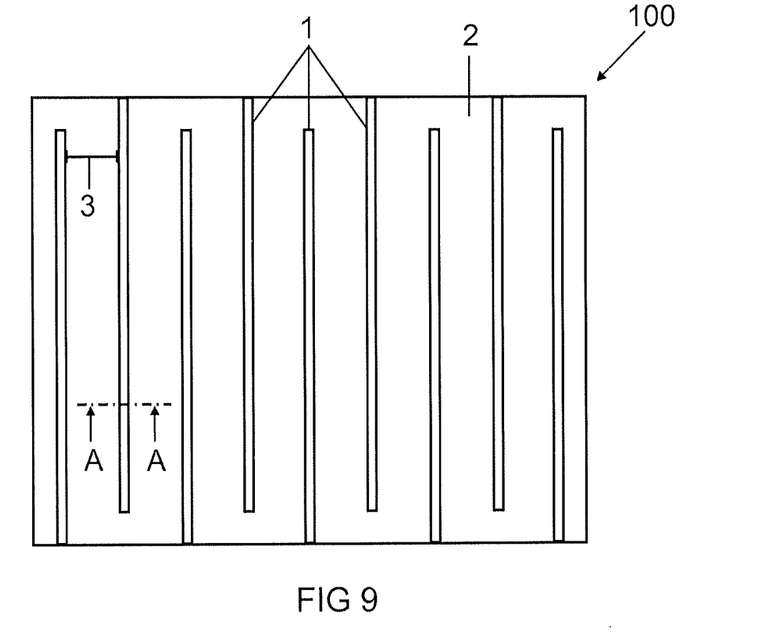
FIG. 9 shows a schematic illustration of a radiation-emitting device in accordance with a further example in a front view.

The examples illustrated in FIGS. 3 to 8 are not restricted to the geometry illustrated in FIG. 1. Rather, an arrangement of the transparency regions 1 as illustrated in FIG. 9 is also possible, in which the transparency regions are strip-shaped and arranged parallel to one another. In the example in FIG. 9, too, the non-transparency region 2 is continuous. The sectional illustrations in FIGS. 3 to 8 correspond to the line A-A depicted in FIG. 9.

In a further example (not illustrated), the first and second electrode surfaces are transparent and extend over the total surface area of the radiation-emitting device 100. A first auxiliary electrode arranged in the non-transparency region 2 connects to the first electrode surface, and a second auxiliary electrode arranged in the non-transparency region 2 connects to the second electrode surface. Preferably, the two auxiliary electrodes do not extend over a total surface area of the non-transparency region 2, but rather are, for example, strip-shaped busbar electrodes ("busbars") which reduce a voltage drop across the transparent electrode surfaces connected to them.

In a further example (not illustrated), the organic functional layer stack 14 having the organic electroluminescent layer 15 does not extend into the transparency regions 1. In particular, the transparency regions 1 can be provided as simple bores in the otherwise homogeneous radiation-emitting device 100.

The radiation-emitting device 100 can advantageously be used in a plurality of applications.

In accordance with a first application, the radiation-emitting device 100 can be used as part of a door, in particular of a door of a microwave oven. In this case, it is possible, on the one hand, to use a structure which emits on both sides as illustrated in FIG. 8, and by which illumination of the interior and exterior of the microwave oven can be achieved. On the other hand, it is possible to use a structure which emits on one side in accordance with FIGS. 3 to 7. Preferably, the radiation-emitting device is arranged such that light is emitted from the non-transparency region 2 in the direction of the interior of the microwave oven. Use of the radiation-emitting device 100 in accordance with the example illustrated in FIG. 7 additionally makes it possible to illuminate the exterior of the microwave oven from the transparency regions 1.

In accordance with a second application, the radiation-emitting device 100 is used as a strip-shaped part of a glass door arranged, for example, at eye level of a potential observer to generate a signal character. That region of the glass door comprising the radiation-emitting device 100 appears brighter than the rest of the area, but has an effective transparency.

Figure 10:
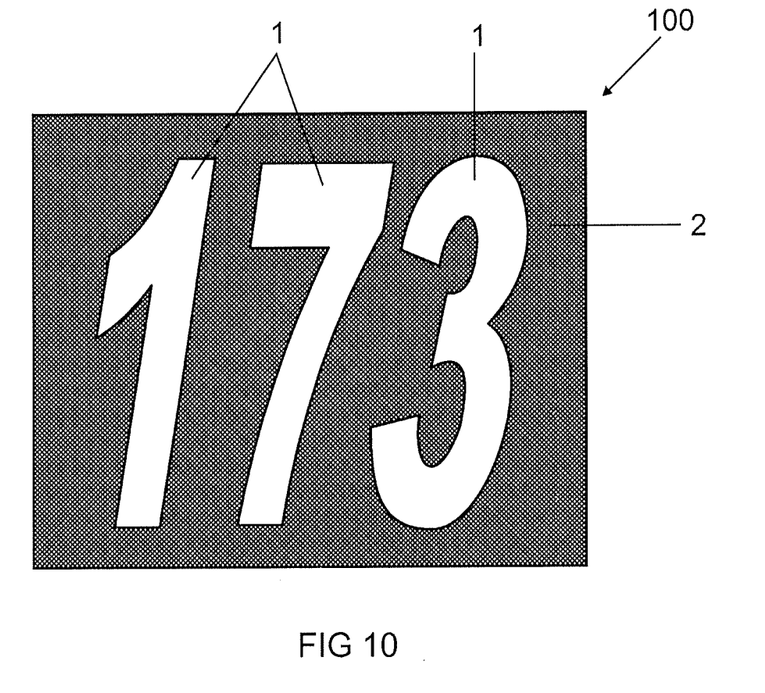
FIGS. 10 and 11 show schematic illustrations of applications of the radiation-emitting device.
Figure 11:
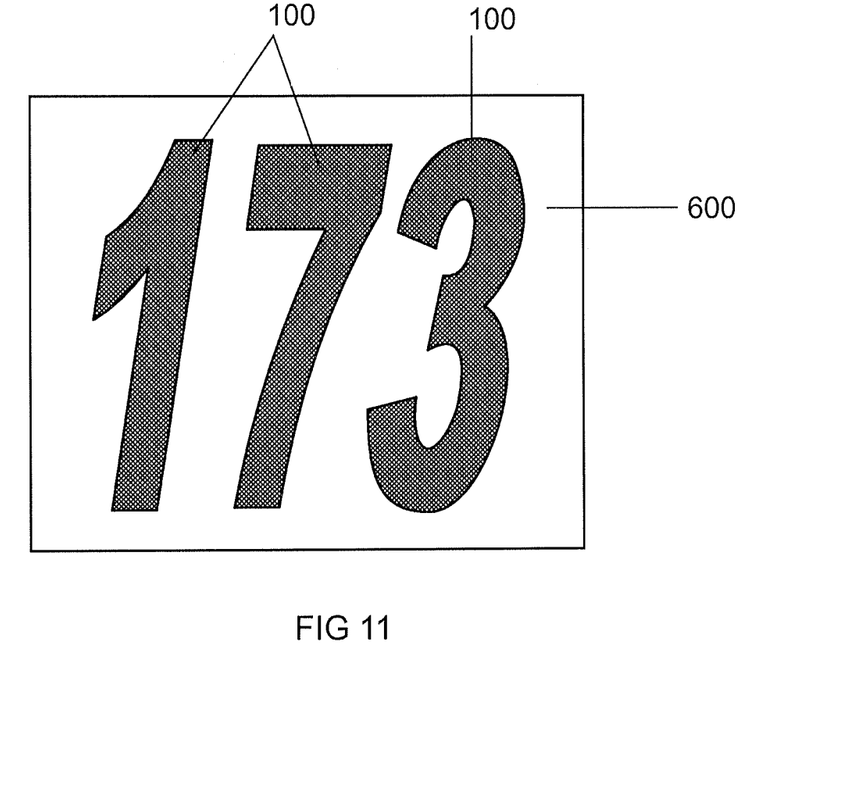

In accordance with a third application, the radiation-emitting device 100 is configured such that it images lettering or patterns. FIG. 10 shows an example of an effectively transparent tile with the house number comprising the radiation-emitting device 100, in which transparency regions 1 are in the form of the desired numerals to be imaged. If the radiation-emitting device 100 is in accordance with one of the examples in FIGS. 3 to 8, then the numerals appear dark on a bright surface in a switched-on operating state. However, a contrast reversal is also possible by the transparency regions 1 and the non-transparency region 2 being interchanged with one another or by the numerals themselves each comprising radiation-emitting devices 100 arranged in a glass substrate 600, for example, as is illustrated in FIG. 11.

The invention claimed is:

1. A radiation-emitting device comprising:
a substrate,
at least one layer sequence arranged on the substrate and adapted to generate electromagnetic radiation, comprising:
at least one first electrode,
at least one second electrode, and
at least one functional layer between the first electrode and the second electrode, wherein the functional layer is adapted to generate the electromagnetic radiation in a switched-on operating state,
a plurality of transparency regions including at least one transparency region transparent to at least one partial spectrum of electromagnetic radiation of visible light at least in a switched-off operating state, and all transparency regions of the plurality of transparency regions together occupy less than 30% of a total surface area of the radiation-emitting device perpendicular to a viewing axis, and
at least one non-transparency region non transparent to the partial spectrum of electromagnetic radiation,
wherein the transparency region and the non-transparency region are arranged such that electromagnetic radiation from the partial spectrum can pass through the radiation-emitting device through the transparency region,
in a switched-off operating state of the radiation-emitting device, the transparency regions are image-transmissive or viewing-transmissive to visible light,
in a switched-off operating state of the radiation-emitting device, the non-transparency region is translucent, but not image-transmissive or viewing-transmissive to visible light,
the layer sequence comprising the at least one functional layer is arranged partly in the transparency regions and partly in the non-transparency region, and
coupling-out elements are arranged in the at least one non-transparency region, the coupling-out elements being formed by at least one of:
the first electrode is nanostructured,
low index microstructures are introduced between the first electrode and the functional layer, and
microstructures are provided on an outer surface of the substrate.

2. The radiation-emitting device according to claim 1, wherein the at least one functional layer comprises an organic functional layer.

3. The radiation-emitting device according to claim 1, wherein all transparency regions of the plurality of transparency regions are spatially separated from one another.

4. The radiation-emitting device according to claim 1, wherein a distance between two transparency regions is less than 3 mm.

5. The radiation-emitting device according to claim 1, wherein all transparency regions of the plurality of transparency regions are distributed homogeneously in the radiation-emitting device.

6. The radiation-emitting device according to claim 1, wherein all transparency regions of the plurality of transparency regions are strip-shaped and arranged parallel to one another.

7. The radiation-emitting device according to claim 1, wherein all transparency regions of the plurality of transparency regions are arranged in a two-dimensional rectangular or hexagonal lattice.

8. The radiation-emitting device according to claim 1, wherein the coupling-out elements are adapted to couple out electromagnetic radiation from the substrate or the layer sequence.

9. The radiation-emitting device according to claim 1, wherein the first electrode is transparent, and the second electrode is reflective and arranged in the at least one non-transparency region.

10. The radiation-emitting device according to claim 1, wherein the first and second electrodes are transparent.

11. The radiation-emitting device according to claim 1, wherein the first electrode is transparent and at least one first auxiliary electrode conductively connected to the first electrode is arranged in the non-transparency region, and/or the second electrode is transparent and at least one second auxiliary electrode conductively connected to the second electrode is arranged in the non-transparency region.

12. The radiation-emitting device according to claim 11, wherein the first auxiliary electrode is reflective and/or the second auxiliary electrode is reflective.

13. The radiation-emitting device according to claim 1, wherein the second electrode is radiation-reflective and extends only over the non-transparency region, and the at least one functional layer is arranged between the radiation-reflective second electrode and the coupling-out elements.

14. A radiation-emitting device comprising:
a substrate,
at least one layer sequence arranged on the substrate and adapted to generate electromagnetic radiation, comprising:
at least one first electrode,
at least one second electrode, and
at least one functional layer between the first electrode and the second electrode, wherein the functional layer is adapted to generate the electromagnetic radiation in a switched-on operating state,
a plurality of transparency regions transparent to at least one partial spectrum of electromagnetic radiation of visible light at least in a switched-off operating state, and
one continuous non-transparency region non-transparent to the partial spectrum of electromagnetic radiation,
wherein the transparency regions and the non-transparency region are arranged such that electromagnetic radiation from the partial spectrum can pass through the radiation-emitting device through the transparency regions,
the continuous non-transparency region is formed by a part of the radiation-emitting device not formed by the transparency regions so that the continuous non transparency region bounds and encloses each of the transparency regions, and
in a switched-off operating state of the radiation-emitting device, the transparency regions are image-transmissive or viewing-transmissive to visible light,
in a switched-off operating state of the radiation-emitting device, the continuous non-transparency region is translucent, but not image-transmissive or viewing-transmissive to visible light,
the layer sequence comprising the at least one functional layer is arranged partly in the transparency regions and partly in the continuous non-transparency region.

15. The radiation-emitting device according to claim 14, wherein all transparency regions of the plurality of transparency regions occupy less than 30% of a total surface area of the radiation-emitting device perpendicular to a viewing axis.

16. The radiation-emitting device according to claim 14, wherein all transparency regions of the plurality of transparency regions occupy less than 5% of a total surface area of the radiation-emitting device perpendicular to the viewing axis.

17. A radiation-emitting device comprising:
a substrate,
at least one layer sequence arranged on the substrate and adapted to generate electromagnetic radiation, comprising:
at least one first electrode,
at least one second electrode, and
at least one functional layer between the first electrode and the second electrode, wherein the functional layer is adapted to generate the electromagnetic radiation in a switched-on operating state,
a plurality of transparency regions transparent to at least one partial spectrum of electromagnetic radiation of visible light at least in a switched-off operating state, wherein all transparency regions of the plurality of transparency regions are spatially separated from one another, and
at least one non-transparency region non-transparent to the partial spectrum of electromagnetic radiation,
wherein the transparency regions and the non-transparency region are arranged such that electromagnetic radiation from the partial spectrum can pass through the radiation-emitting device through the transparency regions,
at least one coupling-out element is arranged in the at least one non-transparency region, the coupling-out element adapted to couple out electromagnetic radiation from the layer sequence,
the second electrode is radiation-reflective and extends only over the non-transparency region,
the at least one functional layer is arranged between the radiation-reflective second electrode and the at least one coupling-out element,
in a switched-off operating state of the radiation-emitting device, the transparency regions are image-transmissive or viewing-transmissive to visible light,
in a switched-off operating state of the radiation-emitting device, the non-transparency region is translucent, but not image-transmissive or viewing-transmissive to visible light, and
the layer sequence comprising the at least one functional layer is arranged partly in the transparency regions and partly in the non-transparency region.

18. The radiation-emitting device according to claim 17, wherein in the at least one non-transparency region
a scattering layer is provided comprising a matrix material and scattering particles having a refractive index different from that of the matrix material;
the first electrode and/or the second electrode are/is periodically nanostructured;
low index microstructures are introduced between the first electrode and the functional layer and/or between the second electrode and the functional layer;

scattering particles are applied to the first electrode and/or the second electrode; and/or microstructures, microlenses, micropyramids or microstructures produced by roughening are provided on an outer surface of the substrate.

19. The radiation-emitting device according to claim 17, wherein the functional layer comprises an organic electroluminescent layer not extending into the transparency regions, and all the transparency regions are provided as bores in the otherwise homogeneously embodied radiation-emitting device.

* * * * *